United States Patent
Hsu et al.

(10) Patent No.: US 12,218,444 B2
(45) Date of Patent: Feb. 4, 2025

(54) ASSEMBLY FIXTURE FOR PRESS-FITTING CONTACT PINS IN A PRINTED CIRCUIT BOARD ASSEMBLY

(71) Applicant: Microsoft Technology Licensing, LLC, Redmond, WA (US)

(72) Inventors: Pai-Ping Hsu, New Taipei (TW); Shun-Wen Shih, New Taipei (TW)

(73) Assignee: Microsoft Technology Licensing, LLC, Redmond, WA (US)

( * ) Notice: Subject to any disclaimer, the term of this patent is extended or adjusted under 35 U.S.C. 154(b) by 351 days.

(21) Appl. No.: 17/887,163

(22) Filed: Aug. 12, 2022

(65) Prior Publication Data

US 2024/0055786 A1 Feb. 15, 2024

(51) Int. Cl.
*H01R 12/70* (2011.01)
*H01R 12/71* (2011.01)

(52) U.S. Cl.
CPC ....... *H01R 12/7064* (2013.01); *H01R 12/716* (2013.01)

(58) Field of Classification Search
CPC .. H01R 12/7064; H01R 12/716; H01R 12/58; H01R 43/205; H01R 12/523; H05K 3/325; H05K 2201/10303; H05K 2201/1059; H05K 2201/10871; H05K 2203/0195; H05K 3/306
See application file for complete search history.

(56) References Cited

U.S. PATENT DOCUMENTS

| | | | | |
|---|---|---|---|---|
| 4,553,322 A | * | 11/1985 | Cappos | H01R 43/205 |
| | | | | 29/739 |
| 5,151,039 A | * | 9/1992 | Murphy | H01R 12/716 |
| | | | | 439/70 |
| 5,392,510 A | | 2/1995 | Chapman | |

(Continued)

FOREIGN PATENT DOCUMENTS

DE 102019217153 A1 5/2021
EP 4037108 A1 8/2022

OTHER PUBLICATIONS

International Search Report and Written Opinion received for PCT Application No. PCT/US2023/027566, Nov. 8, 2023, 13 pages.

*Primary Examiner* — Travis S Chambers
(74) *Attorney, Agent, or Firm* — Holzer Patel Drennan

(57) ABSTRACT

Printed circuit board assemblies (PCBAs) are a fundamental component used in nearly all electronics. PCBAs provide electrical connections and mechanical support to electronic components and are generally made of copper layers laminated onto, though, and/or between one or more non-conductive substrate layers. Press-fit pin connections are often driven through the non-conductive substrate layers to connect power or ground across multiple conductive copper layers within a PCBA and/or connect electronic components on opposing sides of the substrate layer(s). Some new PCBA designs utilize fewer, but larger contact pins (e.g., power pins) in place of a greater number of smaller contact pins. With larger contact pin sizes, press-fit pin connections become more difficult to achieve with repeatable reliability (Continued)

in electrical connection without damaging surrounding features in a PCBA. The press-fitting assembly fixtures, contact pins, and methods described herein are capable of repeatable reliability and avoiding open and short failures.

20 Claims, 5 Drawing Sheets

(56) References Cited

U.S. PATENT DOCUMENTS

| | | | | |
|---|---|---|---|---|
| 5,507,654 | A * | 4/1996 | Daly | H01R 12/58 |
| | | | | 439/862 |
| 5,516,294 | A * | 5/1996 | Andrews | H01R 24/50 |
| | | | | 439/63 |
| 7,104,811 | B2 * | 9/2006 | Sakata | H01R 43/16 |
| | | | | 439/943 |
| 9,172,172 | B2 * | 10/2015 | Shindo | H01R 13/46 |
| 11,749,922 | B2 * | 9/2023 | Hake | H01R 13/405 |
| | | | | 439/74 |
| 2020/0136333 | A1 | 4/2020 | Yu | |

* cited by examiner

ASSEMBLY FIXTURE FOR PRESS-FITTING CONTACT PINS IN A PRINTED CIRCUIT BOARD ASSEMBLY

BACKGROUND

A printed circuit board assembly (PCBA) mechanically supports and electrically interconnects an array of electronic components using conductive pins, traces, vias, and other features etched from metallic sheets laminated onto non-conductive substrate layers. Press-fit pin connections to apertures in the PCBA must make adequate conductive contact with the conductive layers within the PCBA, while not significantly damaging those layers during assembly.

SUMMARY

Implementations described and claimed herein provide an assembly fixture for a printed circuit board assembly (PCBA) comprising a bottom jig and a top jig. The bottom jig includes a bottom housing with a guide aperture and a guide seat, a guide pin slip fit with the guide aperture and extending out of one end of the bottom housing with a pin head resting against the guide seat, a guide plug in the guide aperture sealing an opposing end of the bottom housing, and a guide spring oriented between the guide pin and the guide plug. The guide spring biases the pin head against the guide seat. The top jig includes a top housing with a pin aperture, the pin aperture sized for a slip fit with a contact pin to-be press fit into the PCBA. The bottom jig is aligned with the top jig such that the guide pin extends out of the bottom housing, through the PCBA, into the pin aperture of the top housing, and meeting the contact pin. The contact pin is press-fit into the PCBA with the assembly fixture maintaining axial alignment.

Implementations described and claimed herein further provide a method of press-fitting pins into a printed circuit board assembly (PCBA), the method comprising providing a bottom jig as described above, inserting the guide pin through an thru-hole in the PCBA, loading a top jig as described above with a contact pin, axially aligning the top jig to the bottom jig using the guide pin extending out of the bottom housing, through the PCBA, into the pin aperture of the top housing, and meeting the contact pin, and press fitting the contact pin into the PCBA by compressing the PCBA between the bottom jig and the top jig.

Other implementations are also described and recited herein. This Summary is provided to introduce a selection of concepts in a simplified form that are further described below in the Detailed Descriptions. This Summary is not intended to identify key features or essential features of the claimed subject matter, nor is it intended to be used to limit the scope of the claimed subject matter.

BRIEF DESCRIPTIONS OF THE DRAWINGS

DETAILED DESCRIPTIONS

Printed circuit board assemblies (PCBAs) are a fundamental component used in nearly all electronics. PCBAs provide electrical connections and mechanical support to electronic components and are generally made of copper layers laminated onto, through, and/or between one or more non-conductive substrate layers. The copper layers are etched with traces, planes, and other features to create electrical connections for the electronic components.

Depending on the circuit complexity and performance requirements, multiple copper layers (e.g., copper clad laminates or CCL's) may be utilized in a singular PCBA. For example, one copper layer may be used to provide an electrical ground, another copper layer may be used to provide an electrical power, and yet another copper layer may be used to provide a de-coupling plane to meet noise and electromagnetic compatibility (EMC) requirements, for example. Press-fit pin connections are often driven through the non-conductive substrate layers to connect power or ground across multiple conductive copper layers within a PCBA and/or connect electronic components on opposing sides of the substrate layer(s).

Some new PCBA designs utilize fewer, but larger contact pins (e.g., power pins) in place of a greater number of smaller contact pins. With larger contact pin sizes (e.g., contact pins in excess of 6 mm in diameter), press-fit pin connections become more difficult to achieve with repeatable reliability in electrical connection without damaging surrounding features in a PCBA. The press-fitting assembly fixtures, contact pins, and methods described herein are capable of repeatable reliability and avoid intermittent (open connections) and tailing (short connections) failures.

Figure 1:
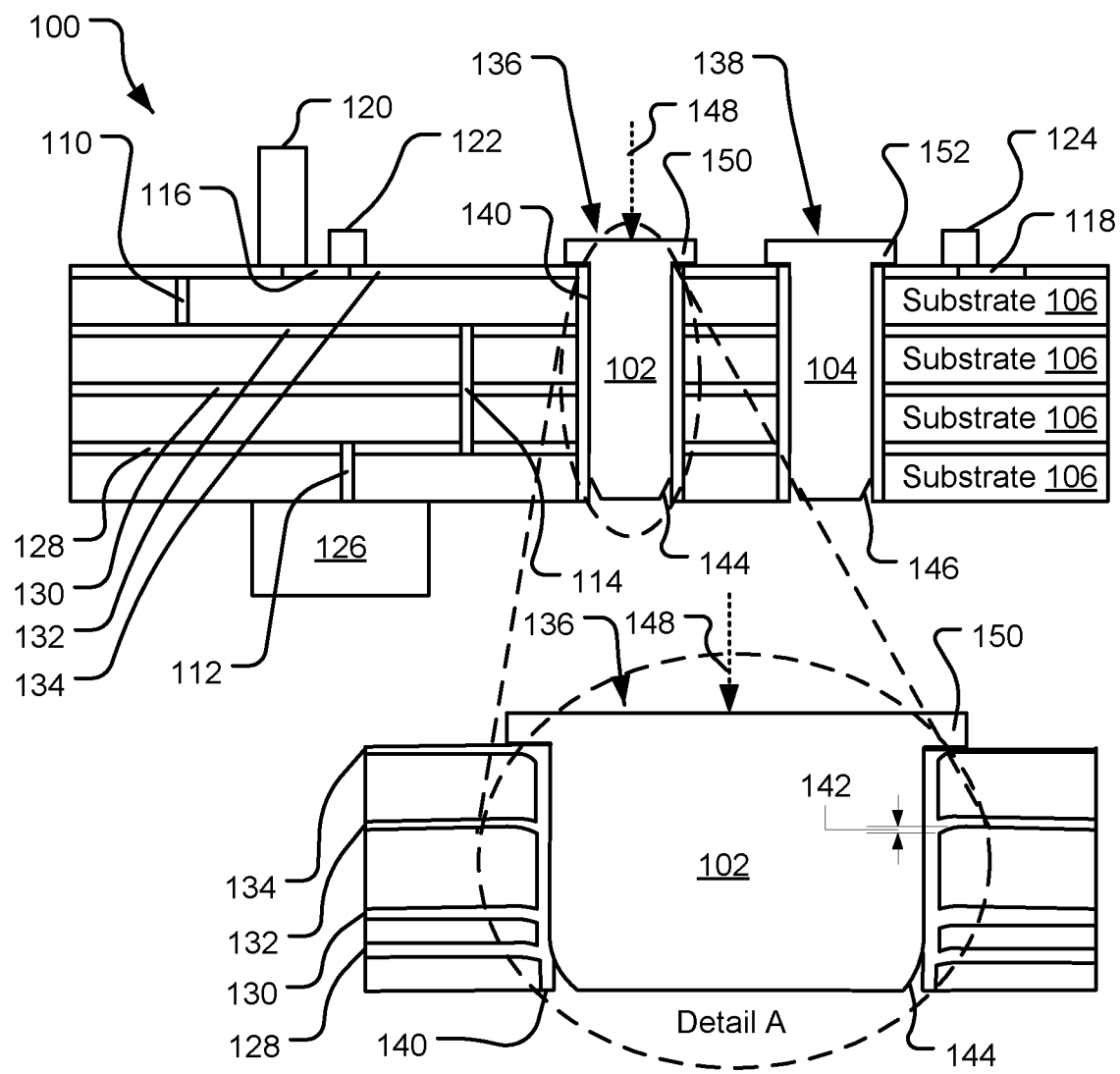
FIG. 1 illustrates an elevation sectional view of an example printed circuit board assembly (PCBA) including a pair of power pins pressed in using an assembly fixture according to the presently disclosed technology.

FIG. 1 illustrates an elevation sectional view of an example printed circuit board assembly (PCBA) 100 including a pair of power pins 102, 104 pressed in using an assembly fixture (not shown, see e.g., assembly fixtures 254, 354 of FIGS. 2 and 3, respectively) according to the presently disclosed technology. The PCBA 100 includes an insulating substrate 106 (e.g., a woven fiberglass cloth with an epoxy resin binder) with a network of conductive layers (e.g., conductive layers 128, 130, 132, 134), vias (e.g., vias 110, 112, 114), traces (e.g., traces 116, 118) and other conductive paths or areas thereon and therethrough. Further, thru-holes 136, 138 are formed in the PCBA 100 and copper clad (e.g., copper cladding 140) for power and/or ground connections. The power pins 102, 104 are press-fit through the copper-clad thru-holes 136, 138, respectively, and are used to connect power across the conductive layers 128, 130, 132, 134 of the PCBA 100.

The PCBA 100 further includes a variety of electronic components (e.g., electronic components 120, 122, 124) soldered to the network of conductive paths on a first side of the substrate 106 and other electronic components (e.g., electronic component 126) attached to a second side of the substrate 106 to create a functional electrical network interconnecting the electronic components on both sides of the substrate 106, within the substrate 106, as well as through the substrate 106.

In various implementations, the electronic components 120, 122, 124, 126 or other electronic components (not shown) may include capacitors, resistors, microprocessors, storage devices, etc. The PCBA 100 may be single-sided (e.g., having one layer forming the conductive network), double-sided (e.g., having two conductive layers forming the conductive network) or multi-layer (e.g., having inner and outer conductive layers forming the conductive network, as shown in FIG. 1). Various implementations described herein may be implemented on single-sided, double-sided, or multi-layer PCBAs.

In various implementations, a far greater number and complexity of conductive traces, vias, copper-clad thru-holes, and other conductive paths, as well as electronic components, are included in the PCBA 100 as compared to that shown in FIG. 1. Further, PCBAs as referred to herein are defined as any insulating substrate with a network of conductive paths formed thereon, therein, and/or therethrough. In various implementations, the substrate 106 may include ceramics, fiberglass, plastics (e.g., flexible polymers), or any combination thereof. The conductive paths or areas are generally made of copper alloys (also referred to as simply copper herein).

Detail A illustrates the power pin 102 press-fit in an axial direction 148 through the copper-clad thru-hole 136. In order to adequately electrically connect the power pin 102 to the copper cladding 140 and one or more of the conductive layers 128, 130, 132, 134, without substantially damaging the copper cladding 140 and/or the conductive layers 128, 130, 132, 134, the copper-clad thru-hole 136 is carefully sized to be slightly smaller in diameter than the power pin 102. In an example implementation, the copper-clad thru-hole 136 is 6.0 mm in diameter, with a +/−0.05 mm tolerance, while the power pin 102 is 6.085 mm in diameter with a +/−0.025 mm tolerance. In this implementation, the interference between the power pin 102 and the copper-clad thru-hole 136 is held to 0.15 mm-0.16 mm for adequate performance (e.g., 0.16 mm is calculated according to a 6.11 mm diameter power pin 102 and a 5.95 mm diameter copper-clad thru-hole 136).

This power pin/thru-hole sizing permits some deformation of the copper cladding 140 as the power pin 102 is press-fit to ensure conductive contact, but not so much deformation of the copper cladding 140 so as to damage the copper cladding 140 (e.g., cause greater than a 33% loss of copper cladding 140 thickness post press-fitting) and/or the adjacent conductive layers 128, 130, 132, 134. In one implementation, deformation 142 of the adjacent conductive layers 128, 130, 132, 134 is limited to up to 0.05 mm (or less than 1% of the power pin diameter) vertically of the conductive layers 128, 130, 132, 134 in the area of the power pin 102 for adequate performance.

The power pins 102, 104 may each include self-centering bottom chamfers 144, 146 that serve to center the power pins 102, 104 in their thru-holes 136, 138 as press-fitting the power pins 102, 104 into the thru-holes 136, 138, all respectively, is begun. The chamfers 144, 146 are at a steep angle (e.g., less than 30 degrees, or approximately 20 degrees, referencing the axial direction 148, to minimize damage to the copper cladding 140 if the power pins 102, 104 are initially slightly off-center with reference to the copper-clad thru-holes 136, 138, respectively. The power pins 102, 104 may each also include top flanges 150, 152, respectively, that rest against the conductive layer 134 (or the surrounding substrate 106) when the power pins 102, 104 are fully seated within their respective thru-holes 136, 138.

In various implementations, press fitting the power pin 104 into the copper clad thru-hole 138, or other press-fit pins into other conductive holes in the PCBA 100 may be similar to that described above with specific reference to power pin 102 and copper-clad thru-hole 136. In other implementations, one or both of the power pins 102, 104 may be ground pins or pins capable of carrying another electrical connection that is not explicitly power or ground (e.g., a signal). In still further implementations, while two power pins 102, 104 are illustrated in FIG. 1, the presently disclosed technology may utilize only one or more than two power pins press-fit to the PCBA 100.

Figure 2:
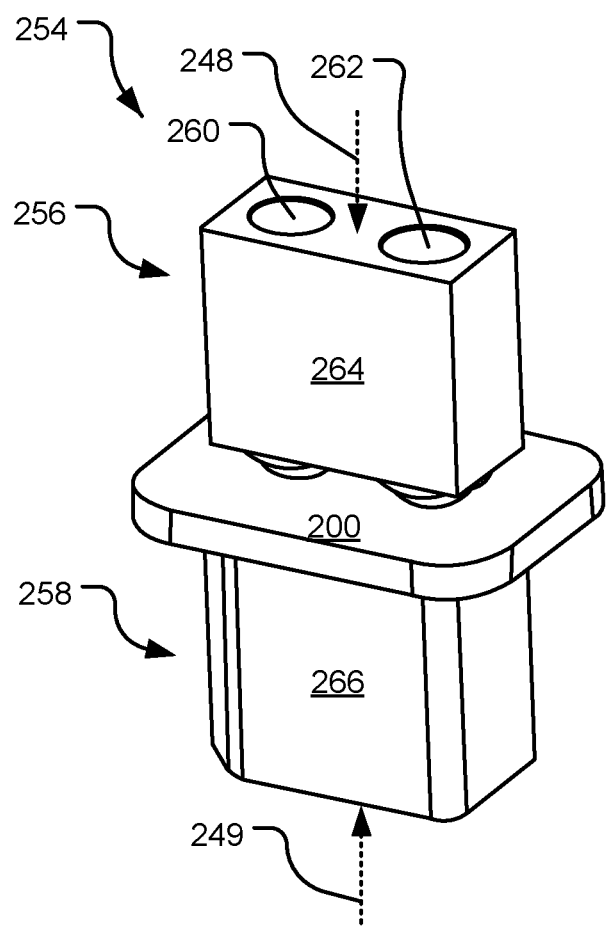
FIG. 2 illustrates a perspective view of an assembly fixture according to the presently disclosed technology used to press-fit contact pins in a PCBA.

FIG. 2 illustrates a perspective view of an assembly fixture 254 according to the presently disclosed technology used to press-fit contact pins in a PCBA 200. Only a small part of the PCBA 200 is illustrated in FIG. 2 for clarity. Further, electronic components (see e.g., electronic components 120, 122, 124 of FIG. 1) and a network of conductive layers (see e.g., conductive layers 128, 130, 132, 134 of FIG. 1), vias (see e.g., vias 110, 112, 114 of FIG. 1), traces (see e.g., traces 116, 118 of FIG. 1), and other conductive paths or areas thereon and therethrough are omitted from FIG. 2 as well for clarity. Various features of the PCBA 200 may be as described above with reference to PCBA 100.

The assembly fixture 254 includes a top jig 256 and a bottom jig 258 arranged on opposing sides of the PCBA 200. The top jig 256 and the bottom jig 258 are aligned such that pin apertures 260, 262 in a top housing 264 of the top jig 256 are axially aligned with corresponding guide pins (not shown see e.g., guide pins 376, 378 of FIG. 3) in a bottom housing 266 of the bottom jig 258.

The pin apertures 260, 262 in the top housing 264 are sized for a slip fit with contact pins (not shown, see e.g., contact pins 302, 304 of FIG. 3) to-be press fit into the PCBA 200. The bottom jig 258 is aligned with the top jig 256 such that the guide pins extend out of the bottom housing 266, through the PCBA 200, into the pin apertures 260, 262 of the top housing 264, and meeting the contact pins. The contact pins are press-fit into the PCBA, as illustrated by arrows 248, 249, with the assembly fixture 254 maintaining axial alignment of contact pins as they are pressed into the PCBA 200 in a direction parallel with the opposing forces illustrated by the arrows 248, 248 and normal to the PCBA 200.

In various example implementations, the press-fitting force applied to the assembly fixture 254 may range from 320N-850N (or be approximately 650N) to fully seat the contact pins to the PCBA 200. The press-fitting force varies both inside and outside of the range provided above based on PCBA stack up layers, associated materials, final PTH hole copper plate thickness, and PCBA/power pin manufacturing tolerances, as examples. The top jig 256 and the bottom jig 258 may each be made of a structurally stiff material (e.g., a metal alloy, such as steel or aluminum alloy) capable of withstanding forces applied to press-fit the contact pins into the PCBA 200 without substantial deflection. Further the assembly fixture 254 may be placed in a press (not shown) to apply the compressive forces illustrated by the arrows 248, 248.

In various implementations, the contact pins may be power (or power-supplying) pins, ground pins, or pins capable of carrying another electrical connection that is not explicitly power or ground (e.g., a signal). Further, while two pin apertures 260, 262 that accommodate two contact pins simultaneously are illustrated in FIG. 2, the presently disclosed technology may be scaled to include an assembly fixture 254 that simultaneously accommodates only one or more than two contact pins to be press-fit to the PCBA 200. Assembly fixtures, such as the assembly fixture 254 of FIG. 2, that accommodate two or more contact pins simultaneously are referred to herein as having sets of duplicated features for each of the contact pins.

Figure 3:
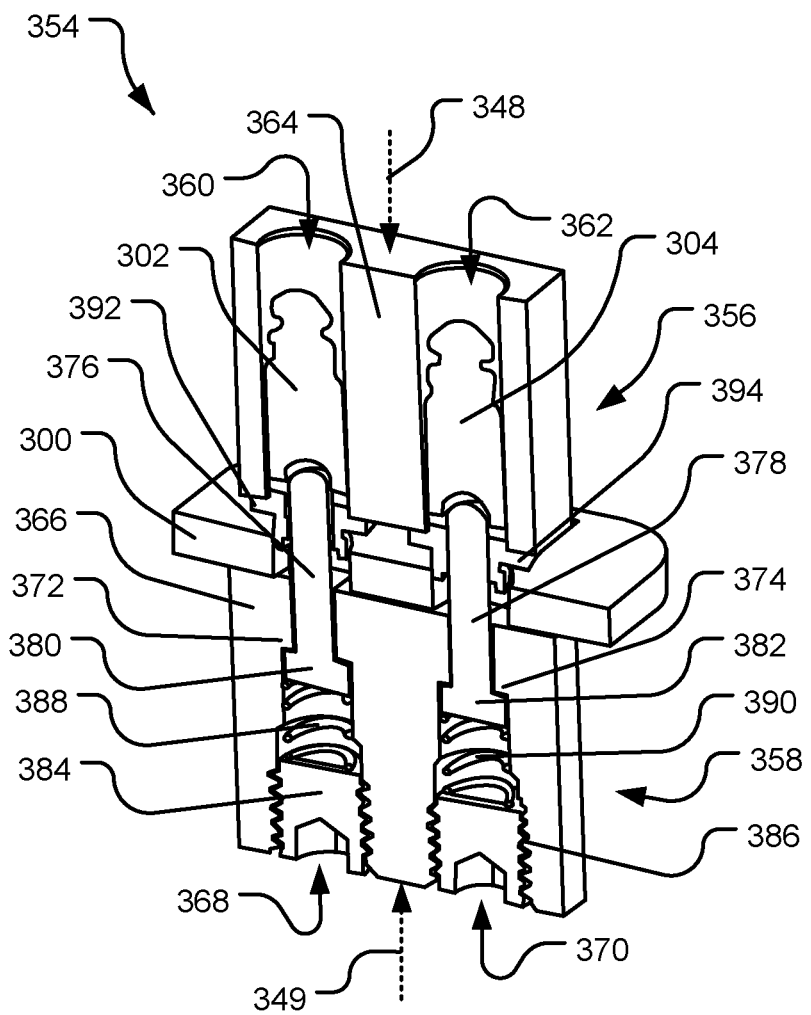
FIG. 3 illustrates a perspective sectional view of an assembly fixture according to the presently disclosed technology used to press-fit contact pins in a PCBA.

FIG. 3 illustrates a perspective sectional view of an assembly fixture 354 according to the presently disclosed technology used to press-fit contact pins 302, 304 in a PCBA 300. Only a small part of the PCBA 300 is illustrated in FIG. 3 for clarity. Further, electronic components (see e.g., electronic components 120, 122, 124 of FIG. 1) and a network of conductive layers (see e.g., conductive layers 128, 130, 132, 134 of FIG. 1), vias (see e.g., vias 110, 112, 114 if FIG. 1), traces (see e.g., traces 116, 118 of FIG. 1), and other conductive paths or areas thereon and therethrough are omitted from FIG. 3 as well for clarity. Various features of the PCBA 300 may be as described above with reference to PCBA 100.

The assembly fixture 354 includes a top jig 356 and a bottom jig 358 arranged on opposing sides of the PCBA 300. The bottom jig 358 includes a bottom housing 366 with a pair of guide apertures 368, 370 extending through the bottom housing 366 and guide seats 372, 374 which are a stepped portion of the guide apertures 368, 370, respectively. Guide pins 376, 378 are slip fit with the guide apertures 368, 370, respectively, and extend out of one end of the bottom housing 366 with pin heads 380, 382 resting against the guide seats 372, 374, respectively.

Guide plugs 384, 386 are screwed into the guide apertures 368, 370, respectively, thereby sealing an opposing end of the bottom housing 366. Guide springs 388, 390 are oriented between the guide pins 376, 378 and the guide plugs 384, 386, respectively. The guide springs 388, 390 bias the pin heads 380, 382 against the guide seats 372, 374. The top jig 356 and the bottom jig 358 are aligned such that pin apertures 360, 362 in atop housing 364 of the top jig 356 are axially aligned with the guide pins 376, 378 in the bottom housing 366 of the bottom jig 358.

The pin apertures 360, 362 in the top housing 364 are sized for a slip fit with the contact pins 302, 304 to-be press fit into the PCBA 300. The contact pins 302, 304 are loaded into a PCBA-facing side of the top jig 356 with pin flanges 392, 394 resting against the top housing 364. The bottom jig 358 is aligned with the top jig 356 such that the guide pins 376, 378 extend out of the bottom housing 366, through the PCBA 300, into the pin apertures 360, 362 of the top housing 364, and meeting the contact pins 302, 304, respectively. The guide pins 376, 378 extend into apertures in the bottom of the contact pins 302, 304, which forces the contact pins 302, 304 in axial alignment with the guide pins 376, 378. The contact pins 302, 304 are press-fit into the PCBA 300, as illustrated by arrows 348, 349, with the assembly fixture 354 maintaining axial alignment of the contact pins 302, 304 as they are pressed into the PCBA 300 in a direction parallel with the opposing forces illustrated by the arrows 348, 348 and normal to the PCBA 300.

In various example implementations, the press-fitting force applied to the assembly fixture 354 may range from 320N-850N (or be approximately 650N) to fully seat the contact pins 302, 304 to the PCBA 300. The press-fitting force varies both inside and outside of the range provided above based on PCBA stack up layers, associated materials, final PTH hole copper plate thickness, and PCBA/power pin manufacturing tolerances, as examples. Various components of the assembly fixture 354, including but not limited to the top jig 356, the bottom jig 358, and the guide pins 376, 378, may each be made of a structurally stiff material (e.g., a metal alloy, such as steel or aluminum alloy) capable of withstanding forces applied to press-fit the contact pins 302, 304 into the PCBA 300 without substantial deflection. Further the assembly fixture 354 may be placed in a press (not shown) to apply the compressive forces illustrated by the arrows 348, 348.

In various implementations, the contact pins 302, 304 may be power (or power-supplying) pins, ground pins, or pins capable of carrying another electrical connection that is not explicitly power or ground (e.g., a signal). Further, while two pin apertures 360, 362 that accommodate two contact pins 302, 304 simultaneously are illustrated in FIG. 3, the presently disclosed technology may be scaled to include an assembly fixture 354 that simultaneously accommodates only one or more than two contact pins 302, 304 to be press-fit to the PCBA 300. Assembly fixtures, such as the assembly fixture 354 of FIG. 3, that accommodate two or more contact pins simultaneously are referred to herein as having sets of duplicated features for each of the contact pins.

Figure 4:
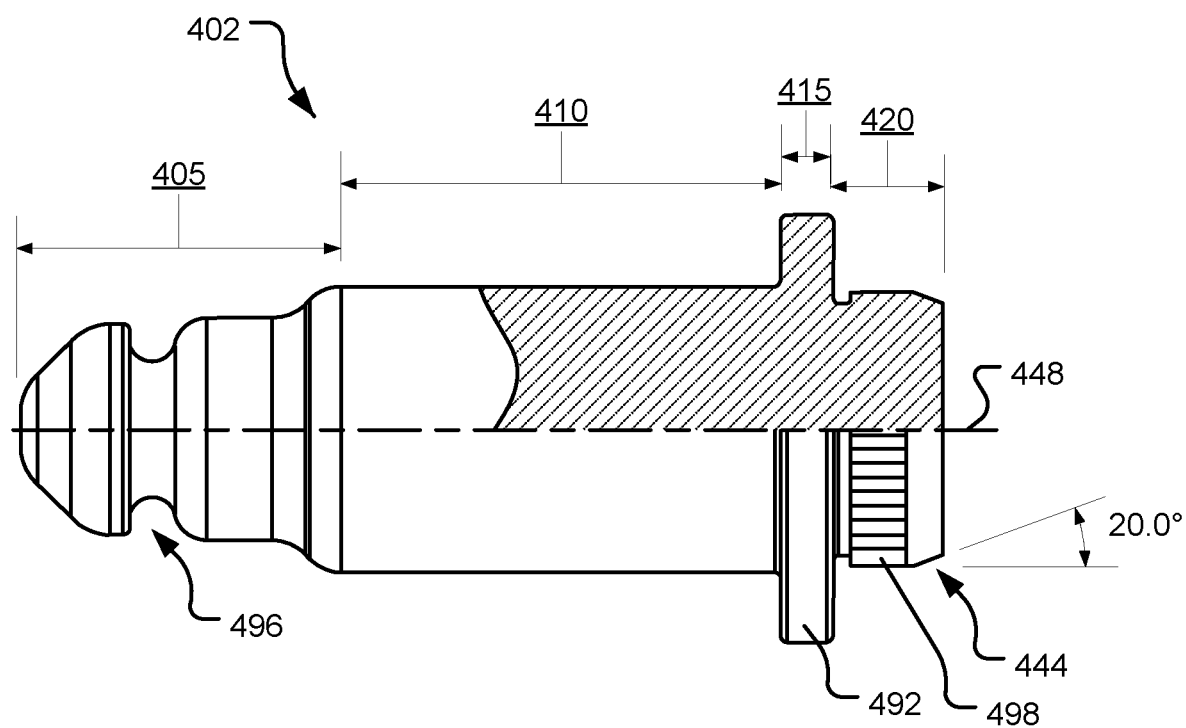
FIG. 4 illustrates an elevation/partial sectional view of a power pin with a steep chamfer to be press-fit using an assembly fixture according to the presently disclosed technology.

FIG. 4 illustrates an elevation/partial sectional view of a power pin 402 with a steep chamfer 444 to be press-fit using an assembly fixture (not shown, see e.g., assembly fixtures 254, 354 of FIGS. 2 and 3, respectively) according to the presently disclosed technology. The power pin 402 is made of a conductive material (e.g., copper, stainless steel, aluminum, or other alloys) with a generally cylindrical shape. The power pin 402 is further generally radially symmetric about axis 448, which is generally aligned with the axial direction discussed elsewhere herein. Other implementations of the power pin 402 may have features or shapes differing from that shown and described with reference to FIG. 4.

The power pin 402 is made up of several distinct sections 405, 410, 415, 420. A connection section 405 serves as an electrical connector (not shown) to a wire or other lead providing power from a power supply (also not shown) to the power pin 402. The connection section 405 includes a recess 496 to seat the electrical connector. A body section 410 serves as a conductive stanchion projecting away from a PCBA (not shown, see e.g., PCBA 100 of FIG. 1) once the power pin 402 is press fit to the PCBA. In some implementations, the connection section 405 and a top end of the body section 410 functionally serves as the electrical connector.

A pin flange section 415 contains pin flange 492, which serves as a mechanical limit to press-fitting the power pin 402 to the PCBA as the pin flange 492 comes in contact with the PCBA once the power pin 402 is fully pressed into the PCBA. An insertion section 420 is the part of the power pin 402 that is seated within a copper clad thru-hole (not shown, see e.g., thru-holes 136, 138 of FIG. 1) in the PCBA. The insertion section 420 has a slightly larger diameter than the copper clad thru-hole, as described above with reference to the power pin 102 and the corresponding copper clad thru-hole 136 of FIG. 1 to ensure good conductive contact, but without damaging the copper-clad thru-hole or various conductive layers of the PCBA.

In various implementations, the insertion section 420 includes the chamfer 444, which is oriented at a steep angle (e.g., less than 30 degrees, or approximately 20 degrees, as illustrated) referencing the axial direction, illustrated by axis 448. The steep angle minimizes damage to the copper cladding within a thru-hole if the power pin 402 is initially slightly off-center with reference to the copper-clad thru-hole to which it is to be press-fit. In other implementations, the chamfer 444 is omitted.

In some implementations, the insertion section 420 further includes exterior surface finishing 498 (e.g., knurling, ribbing, texturing, and the like) to facilitate electrical contact with the copper-clad thru-hole and locking of the power pin 402 within the copper-clad thru-hole. In other implementations, the power pin 402 may be a ground pin or a pin capable of carrying another electrical connection that is not explicitly power or ground (e.g., a signal).

Figure 5:
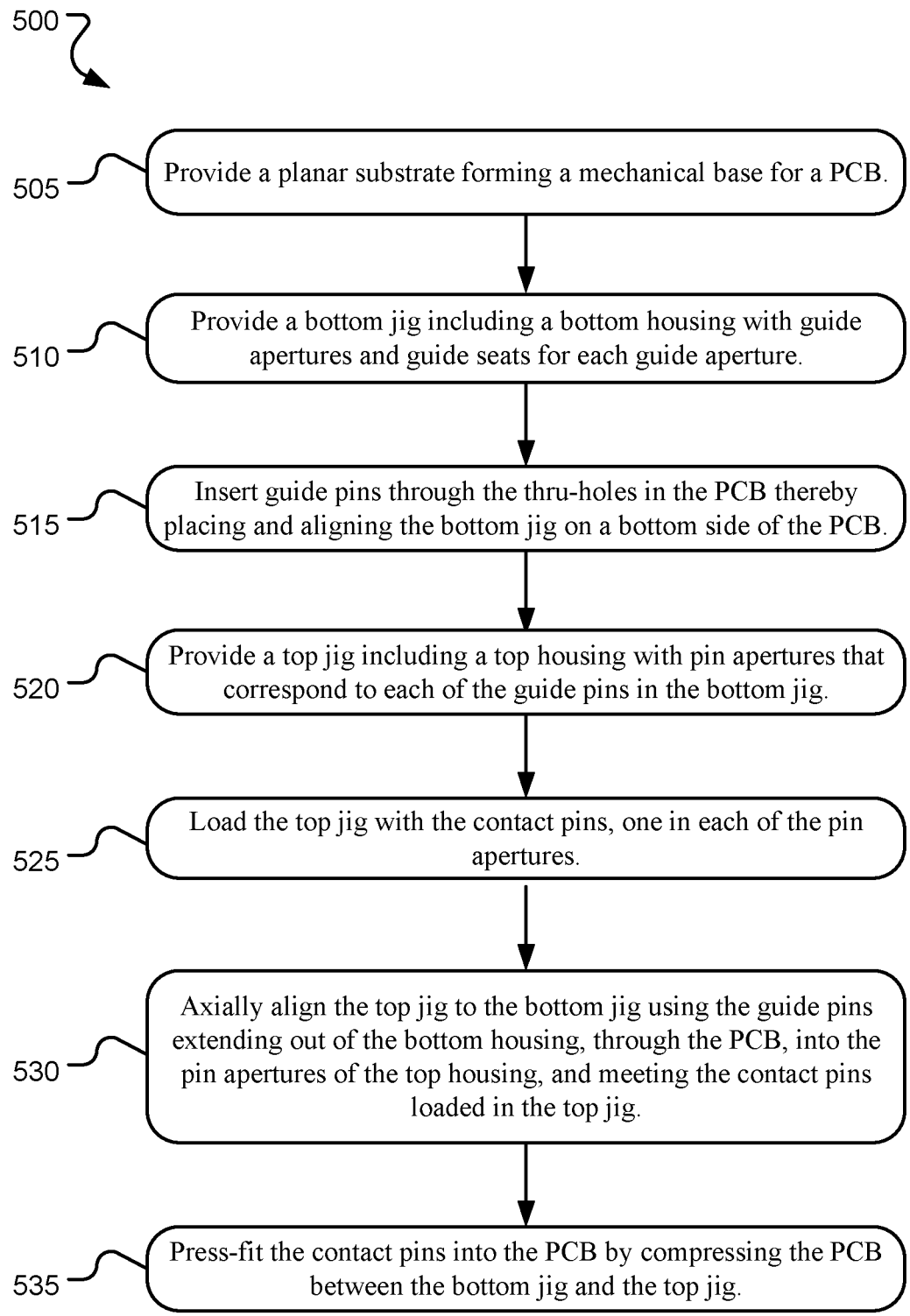
FIG. 5 illustrates example operations for press-fitting contact pins into a PCBA.

FIG. 5 illustrates example operations 500 for press-fitting contact pins into a PCBA. A first providing operation 505 provides a planar substrate forming a mechanical base for the PCBA. In various implementations the PCBA substrate includes ceramics, fiberglass, plastics, or any combination thereof. Further, the PCBA substrate may be an FR-1 through FR-6 material, a G-10 or G-11 material, a CEM-1 through CEM-5 material, PTFE, PTFE composite, RF-35, aluminum or other metal core board (i.e., insulated metal substrate), alumina, polyimide foil, and polyimide-fluoropolymer composite foil.

The planar substrate includes one or more PCBA thru-holes, each of which intended for press-fitting one of the contact pins. The PCBA thru-holes may each be copper-clad to aid in conductive contact with the contact pins, post press-fitting. The pairings of PCBA thru-holes and contact pins may range from one pairing to as many pairings as practical in a PCBA substrate.

A second providing operation 510 provides a bottom jig including a bottom housing with guide apertures and guide seats for each guide aperture. A guide pin is slip fit within each guide aperture and extends out of one end of the bottom housing with a pin head resting against the guide seat. A guide plug is placed in each guide aperture, effectively sealing an opposing end of the bottom housing. A guide spring is oriented between each pairing of a guide pin and a guide plug. The guide springs bias the pin heads against the guide seats.

An insertion operation 515 inserts the guide pins through the thru-holes in the PCBA thereby placing and aligning the bottom jig on a bottom side of the PCBA. A third providing operation 520 provides a top jig including a top housing with pin apertures that correspond to each of the guide pins in the bottom jig. The pin apertures are sized for a slip fit with contact pins to-be press fit into the PCBA. A loading operation 525 loads the top jig with the contact pins, one in each of the pin apertures. Flanges on the contact pins rest against a PCBA-facing side of the top jig when the contact pins are loaded in the top jig.

An alignment operation 530 axially aligns the top jig to the bottom jig using the guide pins extending out of the bottom housing, through the PCBA, into the pin apertures of the top housing, and meeting the contact pins loaded in the top jig. A press-fitting operation 535 press fits the contact pins into the PCBA by compressing the PCBA between the bottom jig and the top jig. In various implementations, the press-fitting operation 535 is accomplished by loading the bottom jig, PCBA, contact pins to-be press fit, and the top jig (collectively, the assembly fixture) into a press that applies sufficient compressive force to press-fit the contact pins into their corresponding thru-holes in the PCBA.

The operations making up the embodiments of the invention described herein are referred to variously as operations, steps, objects, or modules. The operations may be performed in any order, adding or omitting operations as desired, unless explicitly claimed otherwise or a specific order is inherently necessitated by the claim language.

An implementation of the presently disclosed technology includes an assembly fixture for a printed circuit board assembly (PCBA) comprising a bottom jig and a top jig. The bottom jig includes a bottom housing with a guide aperture and a guide seat; a guide pin slip fit with the guide aperture and extending out of one end of the bottom housing with a pin head resting against the guide seat; a guide plug in the guide aperture sealing an opposing end of the bottom housing; and a guide spring oriented between the guide pin and the guide plug, the guide spring to bias the pin head against the guide seat. The top jig includes a top housing with a pin aperture, the pin aperture sized for a slip fit with a contact pin to-be press fit into the PCBA, the bottom jig to be aligned with the top jig such that the guide pin extends out of the bottom housing, through the PCBA, into the pin aperture of the top housing, and meeting the contact pin, the contact pin to be press-fit into the PCBA with the assembly fixture maintaining axial alignment.

In some implementations, the bottom jig includes two or more sets of guide apertures, guide seats, guide pins, pin heads, guide plugs, and guide springs; and the top jig includes two or more sets of pin apertures, wherein each guide pin extends out of the bottom housing, through the PCBA, into a corresponding pin aperture of the top housing, and meeting a corresponding contact pin, each of the contact pins to be press-fit into the PCBA with the assembly fixture maintaining axial alignment.

In some implementations, the contact pin includes a contact pin flange resting against an exterior surface of the top housing facing the PCBA.

In some implementations, the contact pin is fully press-fit into the PCBA when the contact pin flange rests against the PCBA.

In some implementations, the contact pin is a power-supplying pin for the PCBA.

In some implementations, interference between the contact pin and the copper-clad aperture in the PCBA that the contact pin is to be press-fit into is 0.15 mm-0.16 mm.

An implementation of the presently disclosed technology includes a method of press-fitting pins into a printed circuit board assembly (PCBA). The method comprises providing a bottom jig including: a bottom housing with a guide aperture and a guide seat; a guide pin slip fit with the guide aperture and extending out of one end of the bottom housing with a pin head resting against the guide seat; a guide plug in the guide aperture sealing an opposing end of the bottom housing; a guide spring oriented between the guide pin and the guide plug, the guide spring to bias the pin head against the guide seat. The method further comprises inserting the guide pin through an thru-hole in the PCBA, loading a top jig with a contact pin, the top jig including a top housing with a pin aperture, the pin aperture sized for a slip fit with the contact pin to-be press fit into the PCBA, axially aligning the top jig to the bottom jig using the guide pin extending out of the bottom housing, through the PCBA, into the pin aperture of the top housing, and meeting the contact pin; and press fitting the contact pin into the PCBA by compressing the PCBA between the bottom jig and the top jig.

In some implementations, the bottom jig includes two or more sets of guide apertures, guide seats, guide pins, pin heads, guide plugs, and guide springs; the top jig includes two or more sets of pin apertures, each of the pin apertures sized for a slip fit with a contact pin to-be press fit into the PCBA; the insertion operation includes inserting each of the guide pins through a thru-hole in the PCBA; the loading operation includes loading the top jig with each of the contact pins; the aligning operation includes axially aligning the top jig to the bottom jig using each of the guide pins extending out of the bottom housing, through the PCBA, into the pin apertures of the top housing, and meeting the contact pins; and the press fitting operation includes press fitting the contact pins into the PCBA by compressing the PCBA between the bottom jig and the top jig.

In some implementations, the contact pin includes a contact pin flange, and following the loading operation, the contact pin flange rests against an exterior surface of the top housing facing the PCBA.

In some implementations, following the press-fitting operation, the contact pin is fully press-fit into the PCBA when the contact pin flange rests against the PCBA.

In some implementations, the thru-hole in the PCBA is copper clad.

In some implementations, interference between the contact pin and the copper-clad aperture in the PCBA prior to the press-fitting operation is 0.15 mm-0.16 mm.

An implementation of the presently disclosed technology includes an assembly fixture comprising a bottom jig, a printed circuit board assembly (PCBA) including a thru-hole; a power pin to be press-fit into thru-hole in the PCBA; and a top jig. The bottom jig includes a bottom housing with a guide aperture and a guide seat; a guide pin slip fit with the guide aperture and extending out of one end of the bottom housing with a pin head resting against the guide seat; a guide plug in the guide aperture sealing an opposing end of the bottom housing; and a guide spring oriented between the guide pin and the guide plug, the guide spring to bias the pin head against the guide seat. The top jig includes a top housing with a pin aperture, the pin aperture sized for a slip fit with the contact pin, the bottom jig to be aligned with the top jig such that the guide pin extends out of the bottom housing, through the PCBA, into the pin aperture of the top housing, and meeting the power pin, the power pin to be press-fit into the PCBA with the assembly fixture maintaining axial alignment.

In some implementations, the bottom jig includes two or more sets of guide apertures, guide seats, guide pins, pin heads, guide plugs, and guide springs; and the top jig includes two or more sets of pin apertures, wherein each guide pin extends out of the bottom housing, through the PCBA, into a corresponding pin aperture of the top housing, and meeting a corresponding power pin, each of the power pins to be press-fit into the PCBA with the assembly fixture maintaining axial alignment.

In some implementations, the power pin includes a power pin flange resting against an exterior surface of the top housing facing the PCBA.

In some implementations, the power pin is fully press-fit into the PCBA when the power pin flange rests against the PCBA.

In some implementations, the thru-hole in the PCBA is copper clad.

In some implementations, interference between the power pin and the copper-clad aperture in the PCBA that the power pin is to be press-fit into is 0.15 mm-0.16 mm.

In some implementations, the power pin includes a less than 30-degree chamfer on an insertion section of the power pin.

In some implementations, the power pin includes surface finishing on an insertion section of the power pin to facilitate electrical contact with the thru-hole in the PCBA.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. An assembly fixture for a printed circuit board assembly (PCBA) comprising:
    a bottom jig including:
        a bottom housing with a guide aperture and a guide seat;
        a guide pin slip fit with the guide aperture and extending out of one end of the bottom housing with a pin head resting against the guide seat;
        a guide plug in the guide aperture sealing an opposing end of the bottom housing; and
        a guide spring oriented between the guide pin and the guide plug, the guide spring to bias the pin head against the guide seat; and
    a top jig including:
        a top housing with a pin aperture, the pin aperture sized for a slip fit with a contact pin to-be press fit into the PCBA, the bottom jig to be aligned with the top jig such that the guide pin extends out of the bottom housing, through the PCBA, into the pin aperture of the top housing, and meeting the contact pin, the contact pin to be press-fit into the PCBA with the assembly fixture maintaining axial alignment.

2. The assembly fixture of claim 1, wherein:
    the bottom jig includes two or more sets of guide apertures, guide seats, guide pins, pin heads, guide plugs, and guide springs; and
    the top jig includes two or more sets of pin apertures, wherein each guide pin extends out of the bottom housing, through the PCBA, into a corresponding pin aperture of the top housing, and meeting a corresponding contact pin, each of the contact pins to be press-fit into the PCBA with the assembly fixture maintaining axial alignment.

3. The assembly fixture of claim 1, wherein the contact pin includes a contact pin flange resting against an exterior surface of the top housing facing the PCBA.

4. The assembly fixture of claim 3, wherein the contact pin is fully press-fit into the PCBA when the contact pin flange rests against the PCBA.

5. The assembly fixture of claim 1, wherein the contact pin is a power-supplying pin for the PCBA.

6. The assembly fixture of claim 1, wherein interference between the contact pin and a copper-clad aperture in the PCBA that the contact pin is to be press-fit into is 0.15 mm-0.16 mm.

7. A method of press-fitting pins into a printed circuit board assembly (PCBA), the method comprising:
    providing a bottom jig including:
        a bottom housing with a guide aperture and a guide seat;
        a guide pin slip fit with the guide aperture and extending out of one end of the bottom housing with a pin head resting against the guide seat;
        a guide plug in the guide aperture sealing an opposing end of the bottom housing; and
        a guide spring oriented between the guide pin and the guide plug, the guide spring to bias the pin head against the guide seat;
    inserting the guide pin through an thru-hole in the PCBA;
    loading a top jig with a contact pin, the top jig including:
        a top housing with a pin aperture, the pin aperture sized for a slip fit with the contact pin to-be press fit into the PCBA;

axially aligning the top jig to the bottom jig using the guide pin extending out of the bottom housing, through the PCBA, into the pin aperture of the top housing, and meeting the contact pin; and press fitting the contact pin into the PCBA by compressing the PCBA between the bottom jig and the top jig.

8. The method of claim 7, wherein:

the bottom jig includes two or more sets of guide apertures, guide seats, guide pins, pin heads, guide plugs, and guide springs;

the top jig includes two or more sets of pin apertures, each of the pin apertures sized for a slip fit with a contact pin to-be press fit into the PCBA;

the insertion operation includes inserting each of the guide pins through a thru-hole in the PCBA;

the loading operation includes loading the top jig with each of the contact pins;

the aligning operation includes axially aligning the top jig to the bottom jig using each of the guide pins extending out of the bottom housing, through the PCBA, into the pin apertures of the top housing, and meeting the contact pins; and the press fitting operation includes press fitting the contact pins into the PCBA by compressing the PCBA between the bottom jig and the top jig.

9. The method of claim 7, wherein the contact pin includes a contact pin flange, and following the loading operation, the contact pin flange rests against an exterior surface of the top housing facing the PCBA.

10. The method of claim 9, wherein following the press-fitting operation, the contact pin is fully press-fit into the PCBA when the contact pin flange rests against the PCBA.

11. The method of claim 7, wherein the thru-hole in the PCBA is copper clad.

12. The method of claim 11, wherein interference between the contact pin and the copper-clad aperture in the PCBA prior to the press-fitting operation is 0.15 mm-0.16 mm.

13. An assembly fixture comprising:

a bottom jig including:
   a bottom housing with a guide aperture and a guide seat;
   a guide pin slip fit with the guide aperture and extending out of one end of the bottom housing with a pin head resting against the guide seat;
   a guide plug in the guide aperture sealing an opposing end of the bottom housing; and
   a guide spring oriented between the guide pin and the guide plug, the guide spring to bias the pin head against the guide seat;

a printed circuit board assembly (PCBA) including a thru-hole;

a power pin to be press-fit into thru-hole in the PCBA; and a top jig including:
   a top housing with a pin aperture, the pin aperture sized for a slip fit with the contact pin, the bottom jig to be aligned with the top jig such that the guide pin extends out of the bottom housing, through the PCBA, into the pin aperture of the top housing, and meeting the power pin, the power pin to be press-fit into the PCBA with the assembly fixture maintaining axial alignment.

14. The assembly fixture of claim 13, wherein:

the bottom jig includes two or more sets of guide apertures, guide seats, guide pins, pin heads, guide plugs, and guide springs; and the top jig includes two or more sets of pin apertures, wherein each guide pin extends out of the bottom housing, through the PCBA, into a corresponding pin aperture of the top housing, and meeting a corresponding power pin, each of the power pins to be press-fit into the PCBA with the assembly fixture maintaining axial alignment.

15. The assembly fixture of claim 13, wherein the power pin includes a power pin flange resting against an exterior surface of the top housing facing the PCBA.

16. The assembly fixture of claim 15, wherein the power pin is fully press-fit into the PCBA when the power pin flange rests against the PCBA.

17. The assembly fixture of claim 13, wherein the thru-hole in the PCBA is copper clad.

18. The assembly fixture of claim 17, wherein interference between the power pin and the copper-clad thru-hole in the PCBA that the power pin is to be press-fit into is 0.15 mm-0.16 mm.

19. The assembly fixture of claim 13, wherein the power pin includes a less than 30-degree chamfer on an insertion section of the power pin.

20. The assembly fixture of claim 13, wherein the power pin includes surface finishing on an insertion section of the power pin to facilitate electrical contact with the thru-hole in the PCBA.

* * * * *